United States Patent [19]
Tanaka et al.

[11] Patent Number: 5,875,148
[45] Date of Patent: *Feb. 23, 1999

[54] SEMICONDUCTOR MEMORY

[75] Inventors: Yasuhiro Tanaka; Satoru Tanoi, both of Tokyo, Japan

[73] Assignee: OKI Electric Industry Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 454,118
[22] PCT Filed: Jan. 28, 1994
[86] PCT No.: PCT/JP94/00115
§ 371 Date: Jun. 2, 1995
§ 102(e) Date: Jun. 2, 1995
[87] PCT Pub. No.: WO94/17554
PCT Pub. Date: Aug. 4, 1994

[30] Foreign Application Priority Data

Jan. 29, 1993 [JP] Japan ................... 5-012999

[51] Int. Cl.$^6$ .................................. G11C 8/00
[52] U.S. Cl. ................. 365/230.06; 365/189.11
[58] Field of Search ............. 365/149, 189.09, 365/189.11, 230.03, 230.06

[56] References Cited

U.S. PATENT DOCUMENTS

| | | | |
|---|---|---|---|
| 4,782,465 | 11/1988 | Uchida | 365/72 |
| 4,914,630 | 4/1990 | Fujishima et al. | 365/230.03 |
| 4,967,396 | 10/1990 | Kajigaya et al. | 365/207 |
| 5,083,294 | 1/1992 | Okajima | 365/230.03 |
| 5,172,335 | 12/1992 | Sasaki et al. | 365/63 |
| 5,193,074 | 3/1993 | Anami | 365/230.03 |
| 5,253,202 | 10/1993 | Bronner et al. | |

FOREIGN PATENT DOCUMENTS

| | | |
|---|---|---|
| 3-77367 | 4/1991 | Japan . |
| 4-278285 | 2/1992 | Japan . |
| 4-252491 | 9/1992 | Japan . |
| 4-318392 | 11/1992 | Japan . |

OTHER PUBLICATIONS

Symposium on VLSI Circuits Digest of Technical Papers IEEE (1992) "A Boosted Dual Word–Line Decoding Scheme for 256 mb DRAMs", pp. 112–113, K. Noda et al.

Primary Examiner—A. Zarabian
Attorney, Agent, or Firm—Venable; Robert J. Frank

[57] ABSTRACT

A plurality of memory cell arrays each having a plurality of memory cells and a plurality of word lines the word lines are driven by drive circuits which share the driving operation, and permit reading out from and writing into the memory cells connected to the word lines WL to be driven. These drive circuits are respectively connected to main word lines WLO, which are driven by decoding the entered address information in a decoding circuit whereby the drive circuits are driven. Since the main word lines WLO are formed with a third metal wiring layer, a wiring of the word lines can be formed with a gate wiring layer of a transistor and a first metal wiring layer and wiring of a line control circuit can be formed with a second metal wiring layer which intersects the word lines thereby reducing delay operation of the memory.

13 Claims, 5 Drawing Sheets

SEMICONDUCTOR MEMORY

FIELD OF THE INVENTION

The present invention relates to a semiconductor memory such as a dynamic random access memory (hereafter referred to as a "DRAM").

BACKGROUND ART

The following reference describes a conventional DRAM:

Reference: 1992 Symposium on VLSI Circuits Digest of Technical Papers IEEE "A Boosted Dual Word-Line Decoding Scheme for 256 Mb DRAMs" P. 112–113 (K. Noda et al.)

The memory cell area of the conventional DRAM described in this reference is divided by a plurality of memory arrays. This DRAM is provided with a plurality of bit line couples and a plurality of word lines which are intersection-arranged on respective memory cell arrays. Each memory cell array is provided with word line drive circuits for driving the word lines. These word line drive circuits are provided along a plurality of memory arrays. In addition, this DRAM has sense amplifiers connected to a plurality of bit line couples. These sense amplifiers are provided in parallel with the word lines. Line decoders are provided along the word line drive circuits near this memory cell area. These line decoders are used to select the main word lines. A plurality of drive signal generating circuits are arranged concentrated at one-side ends of the word line drive circuits near the memory cell area. These drive signal generating circuits are for supplying the drive signals to a plurality of word line drive circuits.

In this DRAM, a main word line is selected by boosting one of the main word lines to a voltage VBOOT, which is higher than the power supply voltage VCC, by the line decoder. Thus the word line drive circuits connected to the selected main word line become ready to operate. A drive signal generating circuit operates in response to a specified address signal to supply a drive signal to the specified word line drive circuit. The word line drive circuits to which the drive signal is supplied boost the specified word lines connected thereto to the voltage VBOOT and the data stored in the memory cells connected to these word lines is outputted to the bit line couples.

Lately, semiconductor memories such as the DRAM have been demanded to provide higher operating speeds along with the increased storage capacities.

An object of the present invention is to provide a semiconductor memory which has implements high speed operation.

SUMMARY OF THE INVENTION

A semiconductor memory comprising semiconductors as a first aspect of the present invention made to fulfill the above-described object comprises a plurality of bit lines; a plurality of word lines arranged intersecting these bit lines; first and second memory cell arrays having a plurality of memory cells connected to the bit lines and the word lines and arranged at the intersections of these bit lines and word lines; a first drive circuit arranged adjacent to the first memory cell array to drive part of the word lines; a second drive circuit arranged adjacent to the second memory cell array to drive the other part of the word lines; a third drive circuit for driving those word lines arranged adjacent to the word lines to be driven by the first and second drive circuits; a main word line which connects the first, second and third drive circuits to each other, a line control circuit for selecting a bit line according to address information to be entered, and a decoding circuit for decoding the address information and driving the main word lines, wherein the wiring of the word lines is formed by a gate wiring layer of transistors and a first metal wiring layer connected to this gate wiring layer, the wiring of the line control circuit is formed by a second metal wiring layer which is arranged on the first metal wiring layer and intersects the word lines, and the wiring of the main word lines is formed by a third metal wiring layer which is arranged on the second metal wiring layer parallel to the word lines of the first memory cell array and the word lines of the second memory cell array.

With the above, the improvement for higher operation speed is implemented.

To achieve the above-described object, a second aspect of the present invention comprises a plurality of bit lines; a plurality of word lines arranged intersecting these bit lines; a memory cell array having a plurality of memory cells connected to the bit lines and the word lines and arranged at the intersections of these bit lines and word lines; a plurality of drive circuits for driving the word lines; a main word line which connects the plurality of drive circuits to each other; a decoding circuit for decoding the address information to be entered and driving the main word lines; and a level shift circuit for boosting a specified main word line to a higher voltage than a power supply voltage according to an output of the decoding circuit, wherein the plurality of drive circuits are respectively connected to the boosted voltage and the ground voltage, each being formed by an inversion circuit for reversing the boosted voltage of the main word lines and a word line drive circuit for driving a specified word line according to the output of the inversion circuit.

With the above, the improvement for higher operation speed is implemented.

Furthermore, to achieve the above-described object, a third aspect of the present invention comprises a plurality of bit lines; a plurality of word lines arranged to intersect these bit lines; a memory cell array having a plurality of memory cells connected to the bit lines and the word lines and arranged at the intersections of these bit lines and word lines; a plurality of drive circuits for driving the word lines; a main word line which connects the plurality of drive circuits to each other; and a decoding circuit for decoding the address information to be entered and driving the main word lines, wherein the plurality of drive circuits respectively comprise a level shift circuit for boosting a specified main word line to a boosted voltage higher than the power supply voltage according to the output of the decoding circuit and a word line drive circuit for driving a specified word line according to the output of the level shift circuit and the level shift circuit comprises a latch circuit comprising first and second transistors which have a gate electrode and a drain electrode which are cross-connected and a source electrode which receives the boosted voltage, a third transistor which is connected in series between the drain electrode of the first transistor and the main word lines receives the ground voltage at the gate electrode, and a switching circuit which is connected to the drain electrode of the second transistor and the ground voltage and is operated with the voltage of the main word line.

With the above, the improvement for higher operation speed is implemented.

Furthermore, to achieve the above-described object, a fourth aspect of the present invention comprises a plurality of bit lines; a plurality of word lines arranged intersecting these bit lines; a memory cell array having a plurality of memory cells connected to the bit lines and the word lines and arranged at the intersections of these bit lines and word lines; a plurality of drive circuits for driving the word lines; a main word line which connects the plurality of drive circuits to each other; a first decoding circuit for decoding the address information to be entered and driving the main word lines; and a second decoding circuit for decoding the address information and supplying a drive signal to the drive circuits for driving the word lines corresponding to the address information, wherein the plurality of drive circuits respectively comprise the first transistor which has a source electrode connected to the main word line and a gate electrode which receives the ground voltage, the second transistor which has a source electrode connected to the second decoding circuit, a drain electrode connected to the word lines and a gate electrode connected to the drain electrode of the first transistor, and a switching circuit which is connected to the word lines to supply the ground voltage to the word lines in response to the voltage of the main word line.

With the above, the improvement for higher operation speed is implemented.

Furthermore, to achieve the above-described object, a fifth aspect of the present invention comprises a plurality of bit lines; at least first and second word lines arranged to intersect these bit lines; a memory cell array having a plurality of memory cells connected to the bit lines and the word lines and arranged at the intersections of these bit lines and word lines; a plurality of drive circuits for driving the word lines; a main word line which connects the plurality of drive circuits to each other; a first decoding circuit for decoding the address information to be entered and driving the main word lines; and second and third decoding circuits for decoding the address information and supplying drive signals to the drive circuits for driving the word lines corresponding to the address information, wherein the plurality of drive circuits respectively comprise an inversion circuit which receives a higher boosted voltage than the power supply voltage and the ground voltage and inverts the voltage of the main word line and the first and second word line drive circuits for driving the specified word lines in response to the output of the inversion circuit, the first word line drive circuit is controlled by the output of the second word line drive circuit, and the second word line drive circuit is controlled by the output of the third decoding circuit.

With the above, the improvement for higher operation speed is implemented.

Furthermore, to achieve the above-described object, a sixth aspect of the present invention comprises a plurality of bit lines; a plurality of word lines arranged intersecting these bit lines; a memory cell array having a plurality of memory cells connected to the bit lines and the word lines and arranged at the intersections of these bit lines and word lines; a plurality of drive circuits arranged adjacent to the memory cell array to drive the corresponding word lines, respectively; and a plurality of decoding circuits for supplying drive signals to the drive circuits for driving the word lines corresponding to the address information, wherein the plurality of decoding circuits are respectively arranged at both sides of the plurality of drive circuits.

With the above, the improvement for higher operation speed is implemented.

BRIEF DESCRIPTION OF THE DRAWINGS

FIGS. 2, 2a and 2b are cross-sectional views taken along the lines 2—2, 2a—2a and 2b—2b of FIG. 1;

DESCRIPTION OF THE PREFERRED EMBODIMENTS

The present invention is described in detail referring to the accompanying drawings. In the description, a DRAM is used as a semiconductor memory.

Figure 1:
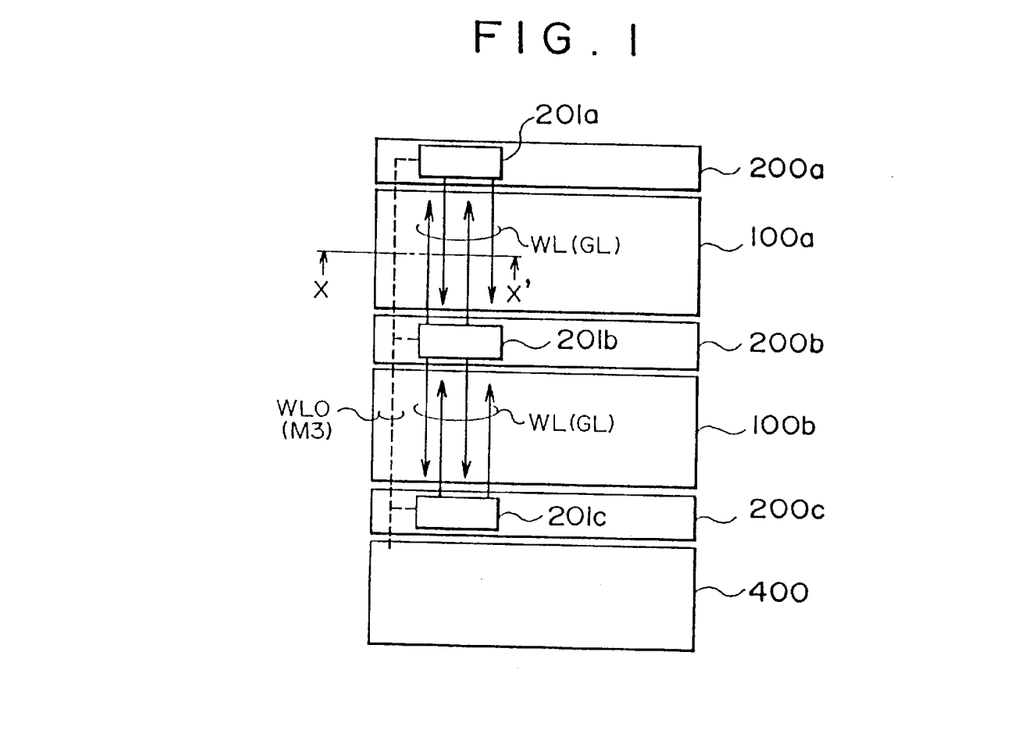
FIG. 1 is a configuration block diagram of a main part of a semiconductor memory showing a first embodiment of the present invention.

FIG. 1 is a configuration block diagram of a main part of a DRAM showing a first embodiment of the present invention.

This DRAM is provided with memory cell arrays 100a and 100b for storing a plurality of data (though two memory cell arrays are shown in FIG. 1, the number of the arrays is not limited). Each of the memory cell arrays 100a and 100b is divided into a plurality of memory cell blocks and has a plurality of word lines WL and bit line couples (not shown) arranged to intersect the plurality of word lines WL. Memory cells 9 are located in each of the memory cell blocks and are respectively connected to intersections of the word lines WL and the bit lines. Drive circuit groups 200a, 200b and 200c (though three drive circuit groups are shown in FIG. 1, the number of groups is not limited to this) for driving the word lines WL are alternately arranged at both sides of the memory cell arrays, respectively. Each of the drive circuit groups 200a, 200b and 200c respectively comprise a plurality of drive circuits such as drive circuits 201a, 102b and 201c. The drive circuits 201a, 201b and 201c drive some of the word lines driven by the drive circuit groups 200a, 200b and 200c and other word lines WL are driven by other drive circuits, not shown. A plurality of main word lines WLO are connected to a decoder circuit 400 which drives the drive circuits in groups 200a, 200b and 200c and a string decoder (not shown. The decoder circuit 400 decodes address information to be entered and functions to selectively drive a main word line WL0 corresponding to this address information which is selected from the plurality of main word lines WLO. In addition, this DRAM has a line control circuit (not shown) for selecting and driving the bit lines.

The operation of the DRAM having the above configuration is described below. An address information which designates a memory cell 9 which receives a read or write request is entered and a specified main word line WLO is selected and driven in response to this address information. The drive circuits 201a, 201b and 201c of the drive circuit groups 200a, 200b and 200c which are connected to the main word lines WLO when these main word lines WLO are driven selectively actuate a plurality of word lines WL. The memory cells connected to the driven word lines WL are activated to be ready for read and write operations. Read and write operations are carried out by sending the data stored in the memory cells to the bit line couples or write data from the bit line couples to the memory cells.

Figure 2:
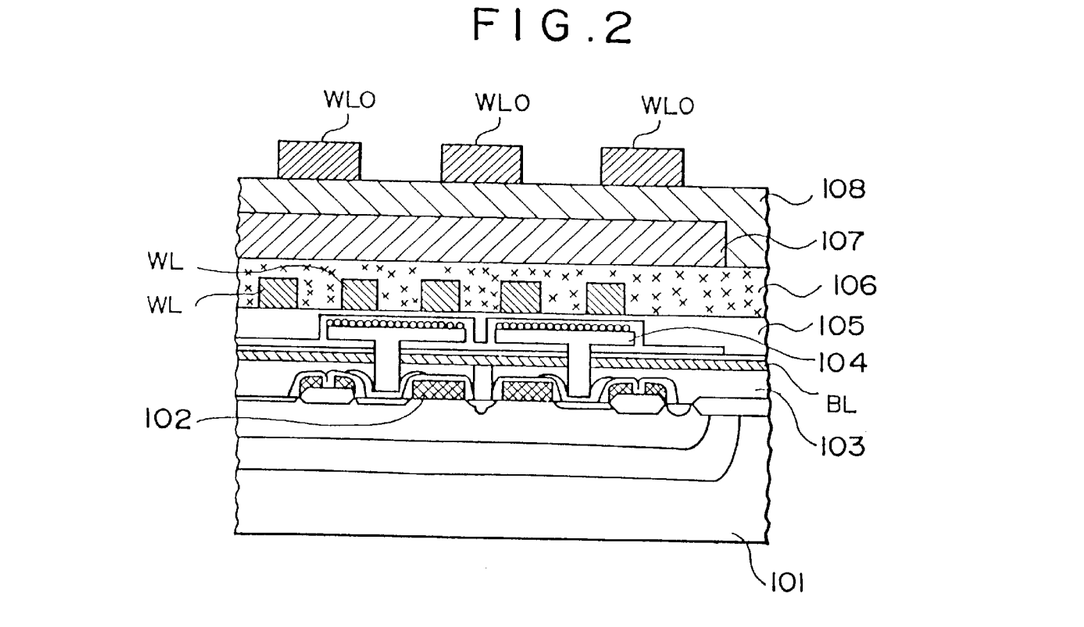

In this case, the wiring configuration of the DRAM shown in FIG. 1 is described referring to FIG. 2. FIG. 2 is a cross sectional view taken along the line 2—2 of in FIG. 1.

Wiring layers or gate electrode lines 102 for the gate electrodes of a plurality of MOS transistors 11 forming the memory cells a are formed on a semiconductor substrate 101. The bit lines BL are formed substantially orthogonal to the wiring layers 102, and a first insulation layer 103 is interposed between the wiring layers 102 and the bit lines BL. A second insulation layer 105 and storage electrodes 104 are formed on bit lines BL. In addition, a plurality of word lines WL, which comprise metal layers, are formed on the second insulation layer 105 to intersect substantially orthogonally the bit lines (which are substantially parallel to the metal wiring layer 102 for the gate electrodes). On the second insulation layer 105 and the word lines WL, a line control line 107, which is an element of a line control circuit made of metal layers, is formed to substantially orthogonally intersect the plurality of word lines WL (which are substantially parallel to the bit lines BL) through a third insulation layer 106. On this line control line 107, a plurality of main word lines WL0 made of metal layers is formed through a fourth insulation layer 108. In this case, the plurality of word lines WL and wiring layers 102 for the gate electrodes are kept in contact with each other by using an area shown in FIG. 2a between memory cell blocks in the memory cell arrays (i.e., areas where the memory cell arrays are not formed, so that the sectional view thereof shows no bit lines BL or storage electrodes 104; instead the area has a contact part 10 for connecting the word lines WL and the wiring layers 102 for the gate electrodes). Also, field oxide regions 12 are formed under the wiring layers 102. These wiring layers 102 for the gate electrodes are used to as a connection the word lines WL. As described above, the parasitic resistance and parasitic capacity of the word lines WL can be reduced as can the delay in signal transmission through the word lines WL, by reducing the number of memory cells driven by one word line drive circuit. This is accomplished by dividing each drive circuit into a plurality of word line drive circuits and connecting these word line drive circuits to the main word lines WL0, and by forming the word lines WL connected with the wiring layers 102 for the gate electrodes without forming the word lines WL only.

FIG. 2b is a cross sectional view similar to FIG. 2a in that it is taken along a line 2b—2b of FIG. 1 where memory cells are not formed. The wiring layers in FIG. 2b, both those having contact with word lines WL an those having no contact with word lines WL, have the same cross sectional shapes as those shown in FIG. 2a. The wiring layers 102 in regions where transistors are formed and in regions where contacts with word lines are made are relatively thick, whereas the wiring layers 102 in regions where no contacts with word lines are made are relatively thin, and appear in two parts in the cross sectional views FIGS. 2a and 2b.

A second embodiment of the present invention is described below.

Figure 3:
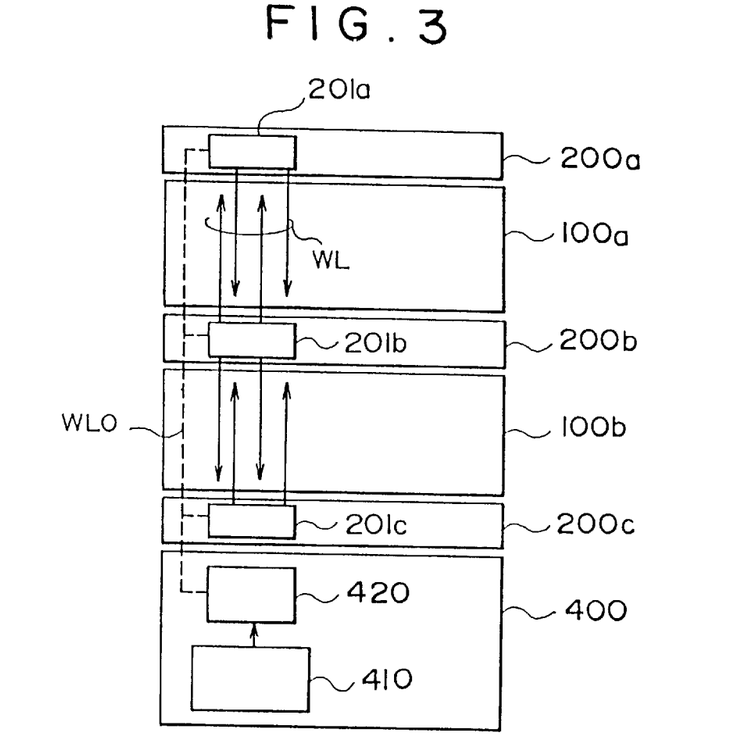
FIG. 3 is a configuration block diagram of a main part of a semiconductor memory showing a second embodiment of the present invention.

FIG. 3 is a configuration block diagram of a main part of a DRAM showing a second embodiment of the present invention. In FIG. 3, the same component parts as in FIG. 1 are given the same reference numerals.

The second embodiment is characterized in that the decoding circuit 400 comprises an address decoding circuit 410 for decoding address information to be entered and a level shifting circuit 420 for level-shifting the output of the address decoding circuit 410 and supplying the output thereof to the main word lines WL0, as shown in FIG. 3.

Figure 4:
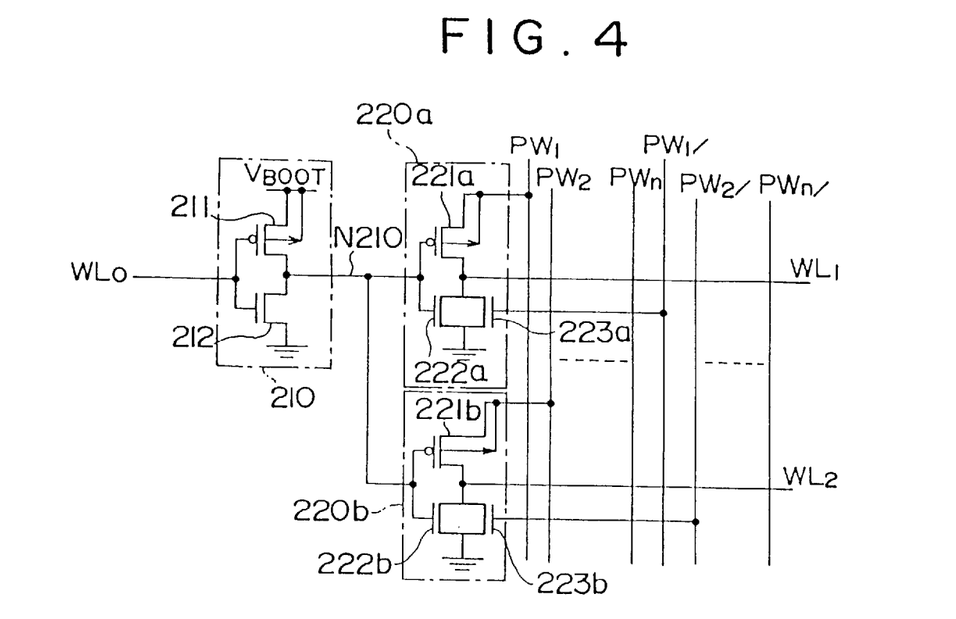
FIG. 4 is a circuit diagram of a drive circuit shown in FIG. 3.

The drive circuits 201a, 201b and 201c comprising drive circuit groups 200a, 200b and 200c each have the same circuit configuration as shown in FIG. 4. In FIG. 4, each of the drive circuits comprises an inversion or buffer circuit 210 which inverts the output voltage of the main word line WL0 and supplies the inverted output voltage to a node N210 and a plurality of word line drive circuits 220a and 220b (though two circuits are shown in FIG. 4, the number of circuits is not limited to this) which operate in response to the voltage at the node N210.

The inversion circuit 210 comprises a P-type MOS transistor (hereafter referred to as "PMOS") 211 and an N-type MOS transistor (hereafter referred to as "NMOS") 212. A boosted voltage VBOOT which is boosted higher than the power supply voltage VCC is supplied to the source electrode of PMOS 211, and the drain electrode of PMOS 211 is connected to the node N210. The gate electrode thereof is connected to the main word line WL0. A ground voltage VSS is supplied to the source electrode of NMOS 212 and the drain electrode of NMOS 212 is connected to the node N210. The gate electrode thereof is connected to the main word line WL0. Therefore, the inversion circuit 210 supplies the ground voltage VSS to the node 210 when the main word lines WL0 remain at a high voltage level (a voltage level at which NMOS 212 can be sufficiently activated; hereafter referred to as "H" level) and a boosted voltage VBOOT to the node N210 when the main word line WL0 remains at a low voltage level (a voltage level at which PMOS can be sufficiently activated; hereafter referred to as "L" level).

The word line drive circuit 220a comprises a MOS transistor, PMOS 221a, NMOS 222a and NMOS 223a. The source electrode of PMOS 221a is connected to the drive signal line PW1 and the drain electrode thereof is connected to the word line WL1. The gate electrode thereof is connected to the node N210. The ground voltage VSS is supplied to ,the source electrode of NMOS 222a and the drain electrode thereof is connected to the word line WL1. The gate electrode thereof is connected to the node N210. The ground voltage VSS is supplied to the source electrode of NMOS 223a and the drain electrode thereof is connected to the word line WL1. The gate electrode thereof is connected to an inversion drive signal line PW1/having a complementary voltage value with respect to the node drive signal line PW1.

The word line drive circuit 220b has a circuit configuration similar to the word line drive circuit 220a in which the MOS transistors PMOS 221b, NMOS 222b and NMOS 223b correspond respectively to PMOS 221a, NMOS 222a and NMOS 223a, and the word line WL1, the drive signal line PW1 and the inversion drive signal line PW1/in the word line drive circuit 220a correspond respectively to the word line WL2, the drive signal line PW2 and the inversion drive signal line PW2/. The word line drive circuits 220a and 220b respectively supply the voltages of the drive signal lines PW1 and PW2 to the word lines WL1 and WL2 when the ground voltage VSS is supplied to the node N210, and supply the ground voltage VSS to the word lines WL1 and WL2, when the boosted voltage VBOOT is supplied to the node N210.

An example of the operating conditions for the drive circuit is, the following drive signal PW1=VBOOT, inversion drive signal PW1/=VSS, drive signals PW2~PWn=VSS, and inversion drive signals PW2/~PWn/=VCC. Under these conditions, when the main word lines WL0 have the "H" level, the word line drive circuits 220a and 220b operate and voltages VBOOT and VSS are respectively supplied to the word lines WL1 and WL2. Accordingly, the memory cells connected to the word line WL1 are activated to permit reading from and writing into these memory cells.

In the second embodiment, the level shifting circuit is incorporated in the decoding circuit 400 and is not provided in the drive circuits 201a, 201b and 201c. Accordingly, the component devices of the circuit can be reduced in number and the output voltage level need not be shifted in each drive circuit and therefor the word lines WL can be started quickly.

In these embodiment, no circuit terminal has a higher voltage than the boosted voltage VBOOT during operation from selection of the main word line WL0 by the decoding circuit 400 to starting of the word lines by the drive circuits 201a, 201b and 201c. Consequently, a high withstand voltage gate oxide film need not be used in MOS transistors which form the drive circuits.

In addition, the drive circuits 201a, 201b and 201c are not provided with a normally-on type NMOS to the gate electrode of which the boosted voltage VBOOT is always supplied and the main word line WL0 is connected to the ground voltage. Therefore, the voltage boosting capacity of the whole DRAM is small and power consumption can be reduced.

Furthermore, since one main word line WL0 is connected to each four word lines WL in the drive circuit groups 200a, 200b and 200c, the wiring pitch (interval) of the main word lines WL0 on the memory cell arrays 100a and 100b can be large and the width of the wiring of the main word lines WL0 can also be large to have a low resistance.

A third embodiment according to the present invention is described below.

Figure 5:
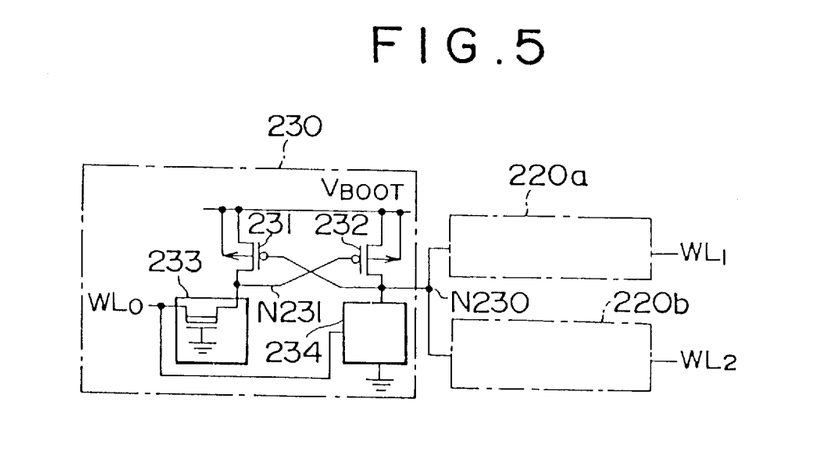
FIG. 5 is a circuit diagram of a drive circuit shown in FIG. 1, showing a third embodiment of the present invention.

FIG. 5 is a circuit diagram of the drive circuit which shows the third embodiment according to the present invention.

This drive circuit conforms to the drive circuits 201a, 201b and 201c shown in FIG. 1. This drive circuit comprises a level shifting circuit 230 for shifting the voltage level of the main word lines WL0 and outputting this level-shifted voltage to the node N230 and the word line drive circuits 220a and 220b (though two word line drive circuits are shown in FIG. 5, the number of circuits is not limited to this) which are connected to the node N230 and drive the word lines WL1 and WL2, respectively, in response to the voltage at the node N230. Since the circuit configuration of these word line drive circuits 220a and 220b is the same as that shown in FIG. 4, the same reference numerals are used and the description is omitted.

The level shifting circuit 230 is composed of two PMOS 231 and PMOS 232 transistors, a transfer gate 233 composed of a depression type NMOS transistor, and a switching circuit 234. The boosted voltage VBOOT is supplied to the source electrodes of PMOS 231 and 232 which form a latch circuit. The drain electrode of PMOS 231 is connected to the gate electrode of PMOS 232 and the gate electrode of PMOS 231 is connected to the drain electrode of PMOS 232 and the node N230. The source electrode of the NMOS which forms the transfer gate 233 is connected to the main word line WL0 and the drain electrode thereof is connected to the drain electrode of PMOS 231. The ground voltage VSS is supplied to the gate electrode of NMOS 233. This transfer gate 233 cinducts current even when the voltage VGS across the gate and source electrodes is 0V and is inactive when the voltage VGS across the gate and source electrodes is a specified voltage lower than 0V. The switching circuit 234 operates with the voltage of the main word line WL0 and the boosted voltage VBOOT is supplied to the node N230. Accordingly, the word line drive circuits 220a and 220b do not drive the word lines when the main word line is not selected.

When the main word line WL0 is selected and starts from the ground voltage VSS, the switching circuit 234 is activated and the voltage of the node N231 begins to rise. At this time, the transfer gate 233 is cut off when the voltage of the main word line WL0 becomes the specified voltage between the ground voltage VSS and the power supply voltage VCC. In addition, when the voltage of the main word line WL0 becomes close to the power supply voltage VCC, the boosted voltage VBOOT appears on the node N231 and PMOS 232 becomes inactive. Therefore, the voltage of the node N230 becomes the ground voltage VSS and the word line drive circuits 220a and 220b drive the word lines. In addition, PMOS 231 becomes activated with the voltage of the node N230 to supply the boosted voltage VBOOT to the node N231 to maintain the voltage of the node N231.

As described above, since the main word lines WL0 need not have the boosted voltage VBOOT, these drive circuits can quickly set the ground voltage VSS at the node N230. The voltage of the node N230 begins to rise when the switching circuit 234 is activated and simultaneously the current of PMOS 232 is reduced and therefore a wasteful passing-through current is not produced and the operation can be speeded up.

Moreover, the level shifting circuit 230 to which the boosted voltage VBOOT is supplied is not provided with the normally-on type NMOS to the gate electrode of which the boosted voltage VBOOT is supplied and therefore power consumption can be reduced.

In addition, a higher voltage than the boosted voltage VBOOT is not supplied to the drive circuits and therefore the high withstand voltage oxide film need not be used in MOS transistors which form the drive circuit.

Moreover, the level shifting circuit 230 is formed with four MOS transistors and the area it occupies is small.

Furthermore, since one main word line WL0 is connected to each four word lines WL in the drive circuit groups 200a, 200b and 200c, the wiring pitch (interval) of the main word lines WL0 on the memory cell arrays 100a and 100b can be large and the wiring width of the main word lines WL0 can be wide to have a low resistance.

The level shifting circuit 230 in these drive circuits can apply to the drive signal generating-circuit which supplies the drive signal PW for selecting the word line drive circuits 220a and 220b.

A fourth embodiment according to the present invention is described below.

Figure 6:
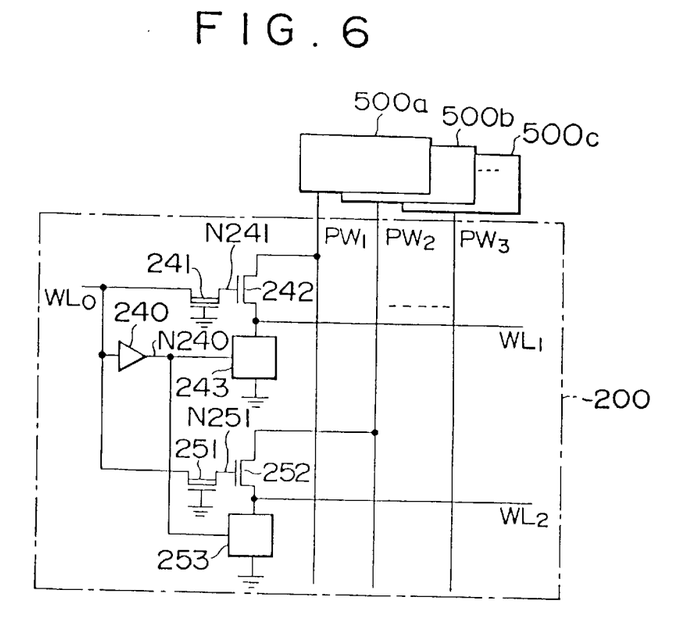
FIG. 6 is a circuit diagram of a drive circuit shown in FIG. 1, showing a fourth embodiment of the present invention.

FIG. 6 is a circuit diagram showing the fourth embodiment according to the present invention.

This drive circuit 201 corresponds to the drive circuit 201a, 201b or 201c shown in FIG. 1. The drive circuit 201 is connected with drive signal lines PW1, PW2 and PW3 for transmitting drive signals to be outputted from a plurality of drive signal generating circuits 500a, 500b and 500c (though three circuits are shown in FIG. 6, the number of circuits is not limited to this) which decode the address information and generate the drive signals for driving the word lines WL.

The drive circuit 201 comprises an inverter 240, two transfer gates 241 and 251 composed of depression type NMOS transistors, two NMOS transistors 242 and 252 and two switching circuits 243 and 253. The inverter 240 inverts the voltage of the main word lines WL0 and supplies the inverted voltage to the node N240. The source electrodes of the NMOS transistors which form the transfer gates 241 and 251 are respectively connected to the main word lines WL0, the drain electrodes thereof are respectively connected to the nodes N241 and N251, and the ground voltage VSS is supplied to the gate electrodes thereof. The source electrodes of NMOS 242 and NMOS 252 are respectively connected to the drive signal lines PW1 and PW2, the drain electrodes thereof are respectively connected to the word lines WL1 and WL2 and the gate electrodes thereof are respectively connected to the nodes N241 and N251. The NMOS transistors which form the transfer gates 241 and 251 conduct current even when the voltage VGS across the gate the source electrodes is 0V and maintain the property that the transfer gates become inactive when the voltage VGS across the gate and source electrodes is a specified voltage lower than 0V. The switching circuits 243 and 253 respectively operate in response to the voltage of the node N240.

Operation of this drive circuit 201 is described below. The main word lines WL0 have the ground voltage VSS at the initial state. At this time, the transfer gates 241 and 251 conduct current and therefore the nodes N241 and N251 have the ground voltage VSS. In this case, the voltage of the node N240 is the power supply voltage VCC. NMOS transistors 242 and 252 become inactive and the switching circuits 243 and 253 are activated in response to the voltages of the nodes N240, N241 and N252. Consequently, the word lines WL1 and WL2 have the ground voltage VSS.

The main word line WL0 is selected and started from the ground voltage VSS and the transfer gates 241 and 251 are cut off when the voltage of the main word line WL0 is a specified voltage between the ground voltage VSS and the power supply voltage VCC. In addition, when the voltage of the main word line WL0 is the power supply voltage VCC, the voltage of the main word line WL0 is inverted by the inverter 240 and the node N240 has the ground voltage VSS and therefore the switching circuits 243 and 253 become inactive. At this time, if, for example, the word line drive signal generating circuit 500a is selected and the boosted voltage VBOOT is supplied to the drive signal line PW1, the voltage to the node N240 is boosted to a voltage higher than VBOOT+VTN (VTN is a threshold voltage of NMOS 242). When the voltage of this node N241 is boosted, NMOS 242 supplies this boosted voltage VBOOT to the word line WL1. With this, the memory cell connected to the word lines WL1 is activated to permit reading from and writing into this memory cell.

As described above, this drive circuit 201 is able to start the word lines WL1 and WL2 without applying the boosted voltage to the main word lines WL0, and the operation speed is raised.

Since this drive circuit 201 is not provided with the normally-on type NMOS to the gate electrode to which the boosted voltage VBOOT is supplied, the capacity for boosting the whole DRAM is small and therefore power consumption can be reduced.

In addition, one main word line WL0 is only connected to each four word lines WL in the drive circuit 201 and the wiring pitch (interval) of the main word lines WL0 on the memory arrays 100a and 100b can be set to be large and therefore the wiring width of the main word lines WL0 can be wide to reduce the resistance thereof.

A fifth embodiment according to the present invention is described below.

Figure 7:
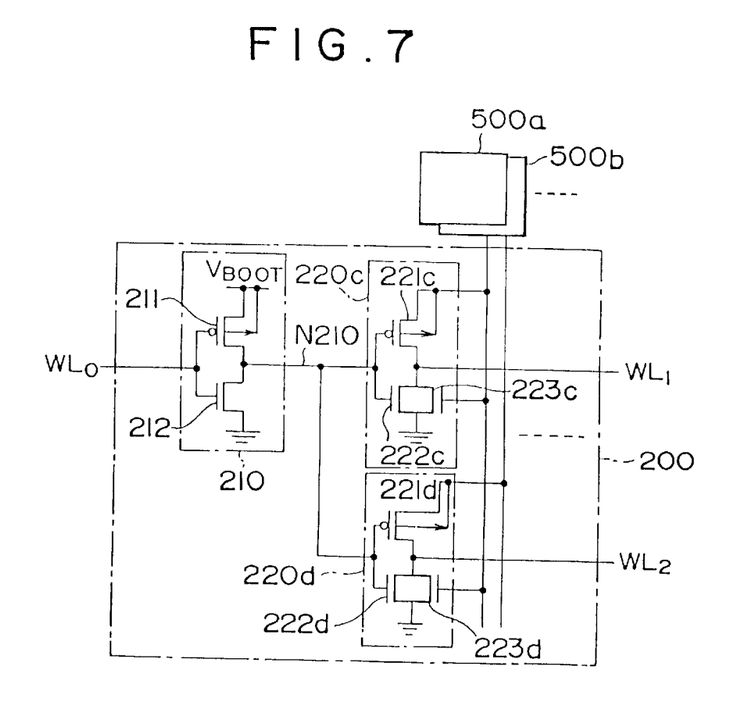
FIG. 7 is a circuit diagram of a drive circuit shown in FIG. 1, showing a fifth embodiment of the present invention.

FIG. 7 is a circuit diagram of a drive circuit 201 showing the fifth embodiment according to the present invention.

This drive circuit corresponds to the drive circuits 201a, 201b and 201c shown in FIG. 1. The drive circuit 201 is provided with two drive signal lines for transmitting drive signals to be outputted from a plurality of drive signal generating circuits 500a and 500b (though two circuits are shown in FIG. 7, the number of circuits is not limited to this) which decode the address information and generate the drive signals for driving the word lines WL.

The drive circuit 201 comprises an inversion or buffer circuit 210 for inverting the voltage of the main word lines WL0 and supplying this inverted voltage to the node N210 and a plurality of word line drive circuits 220c and 220d (though two circuits are shown in FIG. 7, the number of circuits is not limited to this) which operate in response to the voltage of the node N210.

The inversion circuit 210 comprises PMOS 211 and NMOS 212 and has a circuit configuration similar to t he .inversion circuit 210 shown in FIG. 4. Consequently, the inversion circuit 210 supplies the ground voltage VSS to the node N210 when the voltage of the main word lines remains at "H" level and the boosted voltage VBOOT to the node N210 when the voltage of the main word lines remains at "L" level.

The word line drive circuits 220c and 220d have a similar circuit configuration, respectively, and the description in this case is made of the word line drive circuit 220c. The word line drive circuit 220c comprises PMOS 221c and two NMOS 222c and 223c. The source electrode of PMOS 221c is connected to the drive signal line of the drive signal generating circuit 500a and the drain electrode thereof is connected to the word lines WL1. The gate electrode thereof is connected to the node N210. The ground voltage VSS is supplied to the source electrodes of NMOS 222c and 223c and the drain electrodes thereof are respectively connected with the word lines WL1. The gate electrode of NMOS 222c is connected to the node N210 and the gate electrode of NMOS 223c is connected to the drive signal line of the drive signal generating circuit 500b. The word line drive circuit 220d has a circuit configuration similar to that of the word line drive circuit 220c and three MOS transistors, PMOS 221d, NMOS 222d and NMOS 223d, are provided respectively corresponding to PMOS 221c, NMOS 222c and NMOS 223c. The word line WL1 in the word line drive circuit 220c and the drive signal generating circuits 500a and 500b correspond to as the word line WL2, and the drive signal generating circuits 500b and 500a. Consequently, the word line drive circuits 220c and 220d respectively supply the voltages of the signal drive lines of the drive signal generating circuit 500a and 500b to the word lines WL1 and WL2 when the ground voltage VSS is supplied to the node N210 and the ground voltage VSS respectively to the word lines WL1 and WL2 when the boosted voltage VBOOT is supplied to the node N210.

Operation of this drive circuit 201 is described below. The main word lines WL0 are given the ground voltage VSS in the initial condition. Therefore, the boosted voltage VBOOT is supplied to the node N210 by the inversion circuit 210 and the word line drive circuit 220c and 220d respectively supply the ground voltage VSS to the word lines WL1 and WL2.

When the main word line WL0 is selected and the voltage of the main word line WL0 becomes the boosted voltage VBOOT, the ground voltage VSS is supplied to the node N210 by the inversion circuit 210. The PMOS 221c and 221d transistors of the word line drive circuits 220c and 220d are activated and NMOS 222c and 222d transistors are made inactive in response to the voltage of the node N210. When, for example, the drive signal generating circuit 500a is selected, the boosted voltage VBOOT is supplied to the drive signal line of the drive signal generating circuit 500a. In this case, the drive signal generating circuit 500b is not selected and therefore the ground voltage VSS is supplied to the drive signal line of the drive signal generating circuit 500b. Therefore, NMOS 223c of the word line drive circuit 220c is made inactive. The boosted voltage of the drive signal line of the drive signal generating circuit 500a is supplied to the word lines WL1 connected thereto and the memory cell connected to this word line WL1 is activated to permit reading from and writing into this memory cell. In this case, NMOS 223d of the word line drive circuit 220d remains activated and the ground voltage-VSS is supplied to the word line WL2 to prevent a faulty operation (multiple selection of the word lines).

As described above, the word line drive circuits 220c and 220d of this drive circuit 201 are provided with NMOS 223c and 223d transistors which supply the ground voltage VSS to the word lines, which are not selected, in response to the voltage of the drive signal line and therefore the ,inversion drive signal line for supplying the inversion drive signal is unnecessary and the chip size in the direction of the word line can be reduced.

In addition, one main word line WL0 is only connected to each four word lines WL in the drive circuit 201 and the wiring pitch (interval) of the main word lines WL0 on the memory arrays 100a and 100b can be set to be large and therefore the wiring width of the main word lines WL0 can be wide to reduce the resistance thereof.

A sixth embodiment according to the present invention is described below.

Figure 8:
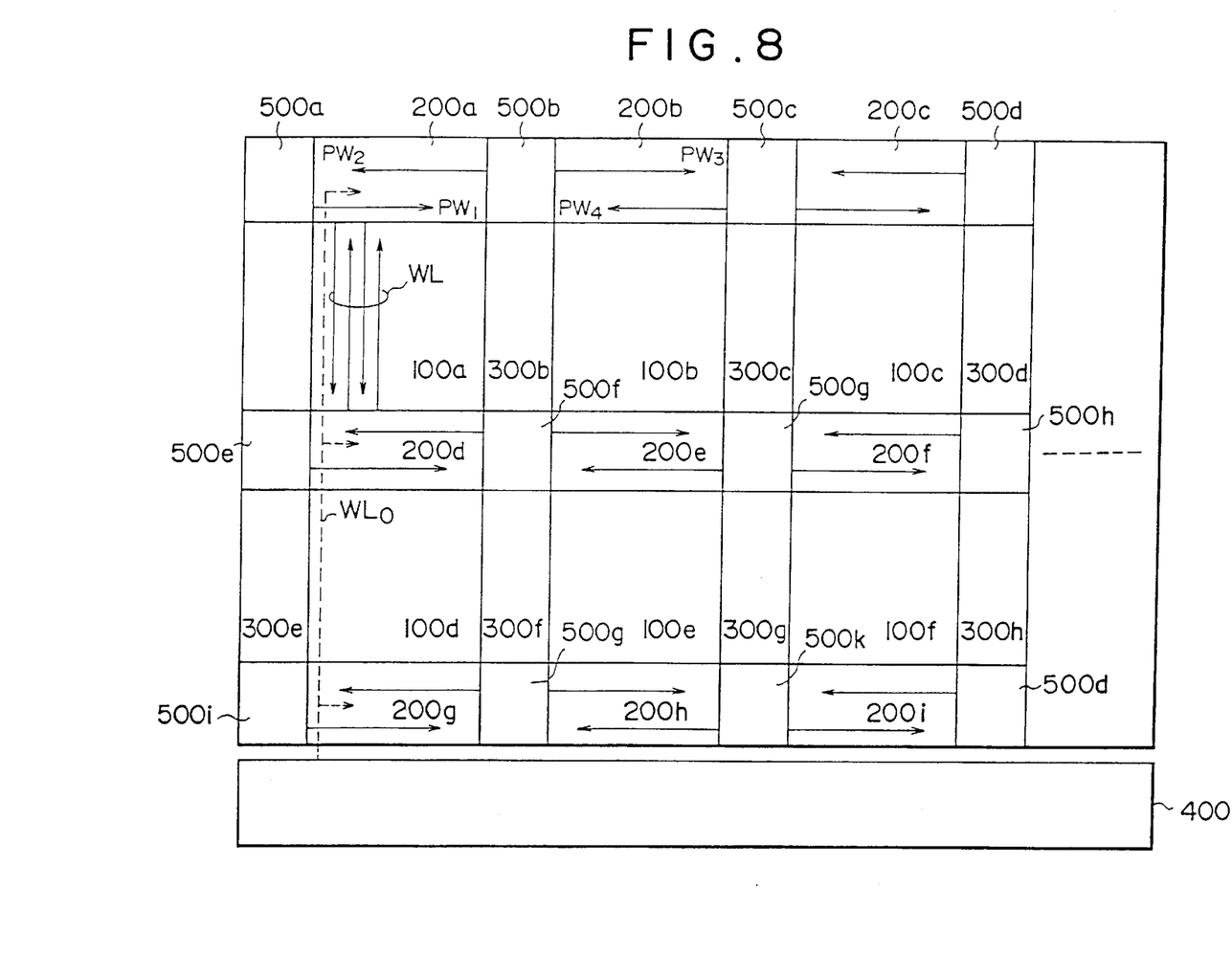
FIG. 8 is a configuration block diagram of a main part of a semiconductor memory showing a sixth embodiment of the present invention.

FIG. 8 is a circuit diagram of the main part of the drive circuit showing the sixth embodiment according to the present invention.

This DRAM is provided with memory cell arrays 100a to 100f (though six memory cell arrays are shown in FIG. 8, the number of the memory cell arrays is not limited to this) for storing a plurality of data. Each of the memory cell arrays 100a to 100f is divided into a plurality of memory cell blocks and has a plurality of word lines WL and bit line couples (not shown) which are arranged to intersect the plurality of word lines WL. Memory cells (not shown) are respectively connected to the intersections of these word lines WL and the bit lines. Drive circuit groups 200a to 200i (though nine drive circuit groups are provided in FIG. 8, the number of groups is not limited to this) for driving respective word lines WL are alternately arranged at both sides of each of the memory cell arrays. For example, the drive circuit groups 200a and 200d are arranged at both sides of the memory cell array 100a. The drive circuit groups 200a to 200f respectively drive the word lines WL and, for example, the drive circuit groups 200a and 200d drive the word lines WL in the memory cell array 100a and the drive circuit groups 200d and 200g drive the word lines WL in the memory cell array 100d. A plurality of main word lines WL0 are connected to the decoding circuit 400 which drives the drive circuit groups 200a to 200f and a string decoder (not shown). For example, a main word line WL0 is connected to the drive circuit groups 200a, 200d and 200g. The decoding circuit 400 functions to decode address information entered and selectively drive the main word line WL0 corresponding to this address information from the plurality of main word lines WL0. In addition, this DRAM has a line control circuit (not shown) for driving the bit lines. Moreover, the sixth embodiment is characterized in that there are arranged drive signal generating circuits 500a to 500l, which form sub decoding circuits, for decoding the address information and driving the drive signal line PW which supplies the drive signal to the word lines WL corresponding to the address information at both sides of the drive circuits 200a to 200i (not adjacent to the memory cell arrays 100a to 100f). For example, the drive signal generating circuits 500a and 500b respectively supply the drive signal to the drive circuit 200a which drives the word lines WL of the drive circuit 200a. Sense amplifiers 300a to 300h for amplifying a difference of voltage values between the bit line couples are arranged at both sides of respective memory cell arrays 100a to 100f.

Operation of this DRAM is described below. For example, the drive signal generating circuit 500b supplies selectively the drive signal to the drive signal lines PW2 and PW3 according to the address information. With this drive signal supplied, the drive circuits 200a and 200b supply the boosted voltage VBOOT to the word lines WL in the memory cell arrays 100a and 100b to permit reading out from and writing into the memory cell array connected to the boosted word lines WL.

In this DRAM, the drive signal generating circuits 500a to 500l are arranged at both sides of the drive circuits 200a to 200i and therefore drive signal generating circuits can be provided without increasing the area of the chip.

Since the parasitic capacity and the parasitic resistance of the wiring of one drive line are reduced, the operating speed can be raised and power consumption can be reduced.

The present invention which has been described in detail above is not limited to the above-described embodiments. The present invention enables various modifications such as, for example, modification or change of the configuration and arrangement of the whole DRAM into different modes from those in the drawings or application to semiconductor memories other than the DRAM specified in the present invention.

INDUSTRIAL APPLICABILITY

As described in detail above, the embodiments according to the present invention enable increases the speed of data read and write operations.

The second and fourth embodiments enable the provision of higher withstand voltage and lower power consumption.

The third embodiment enables the provision of higher withstand voltage, lower power consumption and greater reduction of chip size.

The fifth and sixth embodiments further enable the provision of lower power consumption and greater reduction of chip size.

What is claimed is:

1. A semiconductor memory for storing data, comprising:
 a first wiring layer which includes a pair of bit lines for transferring data, said first wiring layer extending in a first direction;
 a plurality of word lines formed by a second wiring layer extending in a second direction substantially orthogonal to that of said pair of bit lines;
 a memory cell array comprising a plurality of memory cells, each of said memory cells being connected to said pair of bit lines and a word line at intersections of said pair of bit lines and said word line, each memory cell having a transistor; and a gate electrode line extending in said second direction parallel to and spaced from said word lines, said gate electrode line being connected to a gate electrode of the transistor of said memory cell, wherein said gate electrode line is connected to said word lines at a region other than a region wherein a memory cell is formed by a third wiring layer extending in a third direction substantially orthogonal to said first and second directions.

2. A semiconductor memory according to claim 1, further comprising:
   a drive circuit group comprising drive circuits for driving said word lines;
   a decoding signal transferring line connected to said drive circuits for the activation thereof; and
   a decoding circuit for decoding address information and for outputting a selection signal to select said decoding signal transferring line.

3. A semiconductor memory according to claim 2, wherein said plurality of word lines includes first and second word lines, and said drive circuit group includes a first drive circuit driving said first word line and a second drive circuit driving said second word line, said first and second drive circuits being connected to said decoding signal transferring line.

4. A semiconductor memory for storing data, comprising:
   a pair of bit lines extending in a first direction for transferring data;
   a plurality of word lines extending in a direction substantially orthogonal to that of said pair of bit lines;
   a memory cell array comprising a plurality of memory cells, each of said memory cells being connected with said pair of bit lines and a word line and arranged at intersections of said pair of bit lines and said word line;
   a drive circuit for driving a word line, said drive circuit comprising
      a first transistor of a first conductivity type having a first electrode connected to a first drive signal line having a first voltage level, a second electrode connected to said word line and a gate electrode connected to an output node of a buffer circuit;
      a second transistor of a second conductivity type having a gate electrode connected to the output node of said buffer circuit; and
      a third transistor of said second conductivity type having a first electrode supplied by the ground voltage, a second electrode connected to said word line and a gate electrode connected to a second drive signal line having a second voltage level complementary to that of said first drive signal line;
   a decoding signal transferring line connected to said drive circuit for the activation thereof;
   a first decoding circuit for decoding address information and for outputting a selection signal for selecting said decoding signal transferring line;
   a level shifting circuit for boosting said decoding signal transferring line to a boosted voltage higher than a power supply voltage in response to said selection signal, said boosted voltage being supplied to said buffer circuit for outputting an output signal at said output node thereof, said output signal consisting of said boosted voltage or said ground voltage in response to a voltage on said decoding signal transferring line, said drive circuit driving said word line in response to the output signal at the output node of said buffer circuit.

5. A semiconductor memory according to claim 4, wherein said level shifting circuit comprises a latch circuit including
   first and second transistors of a first conductivity type, each of said first and second transistors having a first electrode connected to said boosted voltage, a gate electrode and a second electrode, said gate and second electrode of said first transistor being connected to the second and gate electrodes of said second transistor respectively, and said second electrode of said second transistor being connected to an input of said drive circuit;
a third transistor of said second conductivity type having a first electrode connected to the second electrode of said first transistor and a gate electrode supplied with said ground voltage; and
a switching circuit connected between the second electrode of said second transistor and said ground voltage for operating in response to a voltage on said main word line.

6. A semiconductor memory according to claim 4, wherein said plurality of word lines includes first and second word lines, and said drive circuit includes a first word line drive circuit for driving said first word line and a second word line drive circuit for driving said second word line, said first and second word line drive circuits being connected to said decoding signal transferring line.

7. A semiconductor memory according to claim 6, further comprising:
   a second decoding circuit for decoding said address information and for supplying a first drive signal to drive said first word line via said drive circuit in response to said address information; and
   a third decoding circuit for decoding said address information and for supplying a second drive signal to drive said second word line via said drive circuit in response to said address information; and
   wherein said drive circuit includes
      a first transistor having a first electrode connected to said decoding signal transferring line and a gate electrode receiving a ground voltage;
      a second transistor having a first electrode for receiving said first drive signal, a second electrode connected to said first word line and a gate electrode connected to a second electrode of said first transistor;
      a first switching circuit connected between said first word line and said ground voltage for controlling the supply of the ground voltage to said first word line;
      a third transistor having a first electrode connected to said decoding signal transferring line and a gate electrode for receiving the ground voltage;
      a fourth transistor having a first electrode for receiving said second drive signal, a second electrode connected to said second word line and a gate electrode connected to a second electrode of said third transistor; and
      a second switching circuit for controlling the supply of the ground voltage to said second word line in response to the voltage of said decoding signal transferring line.

8. A semiconductor memory according to claim 6, further comprising:
   a second decoding circuit for decoding said address information and for supplying a first drive signal to drive said first word line via said drive circuit in response to said address information;
   a third decoding circuit for decoding said address information and supplying a second drive signal to drive said second word line via said drive circuit in response to said address information; and a buffer circuit connected to a boosted voltage higher than the power supply voltage and a ground voltage for outputting an output signal having said boosted voltage or said ground voltage in response to a voltage of said decoding signal transferring line; and wherein said first word line drive circuit transfers said first drive signal to said first word line in response to the output signal of said buffer circuit and transfers the voltage of said first word line to the ground voltage when said third decoding circuit supplies said second drive signal; and said second drive circuit transfers said second word line drive signal to said second word line in response to the output signal of said buffer circuit and transforms the voltage of said second word line to the ground voltage when said second decoding circuit supplies said first drive signal.

9. A semiconductor memory according to claim 8, wherein said first word line drive circuit comprises a first transistor of a first conductivity type having a first electrode which receives said first drive signal, a second electrode connected to said first word line, and a gate electrode which receives an output of said buffer circuit;

a second transistor of a second conductivity type having a first electrode which receives the ground voltage, a second electrode connected to said first word line and a gate electrode which receives an output of said buffer circuit; and a third transistor of the second conductivity type connected in parallel with said second transistor and having a gate electrode for receiving said second drive signal; and wherein said second drive circuit comprises a fourth transistor of said first conductivity type having a first electrode which receives said second drive signal, a second electrode connected to said second word line, and a gate electrode which receives an output of said buffer circuit;

a fifth transistor of the second conductivity type having a first electrode which receives the ground voltage, a second electrode connected to said second word line and a gate electrode which receives an output of said buffer circuit; and a sixth transistor of said second conductivity type connected in parallel with said fifth transistor and having a gate electrode which receives said first drive signal.

10. A semiconductor memory for storing data, comprising:

a plurality of bit line pairs, each of said bit line pairs transferring data;

first, second, third and fourth word lines intersecting at least one of said bit line pairs;

a memory cell array having first and second memory cell groups, each memory cell group comprising a plurality of memory cells connected with said bit line and one of said word lines, each of said memory cells being arranged at an intersection of a bit line and a word line;

a first drive circuit for driving said first word line;

a second drive circuit for driving said second and third word lines;

a third drive circuit for driving said fourth word line;

a first sub decoding circuit for decoding address information and for outputting a first drive signal to drive said first word line via said first drive circuit in response to said address information;

a second sub decoding circuit for decoding said address information and for outputting a second drive signal to drive said second or third word line via said second drive circuit in response to said address information;

a third sub decoding circuit for decoding said address information and for outputting a third drive signal to drive said fourth word line via said third drive circuit in response to said address information;

a decoding signal transferring line for connecting said drive circuits to each other for the activation thereof;

a main decoding circuit for decoding said address information and for activating said decoding signal transferring line; and first and second amplification circuits for amplifying voltage differences transferred from one of said bit line pairs, said first memory cell group being arranged between said first and second drive circuits, said first sub decoding circuit beside said first drive circuit, said second sub decoding circuit beside said second drive circuit, and said first amplification circuit between said first and second sub decoding circuits;

said second memory cell group being arranged between said second and third drive circuits, said third sub decoding circuit beside said third drive circuit, and said second amplification circuit between said second and third sub decoding circuits; and said third drive circuit being arranged between said main decoding circuit and said second memory cell group.

11. A semiconductor memory according to claim 1 wherein said word line is arranged above said gate electrode, and wherein said first metal layer extends between said word line and the gate electrode.

12. A semiconductor memory for storing data, comprising:

a first wiring layer which includes a pair of bit lines for transferring data, said first wiring layer extending in a first direction;

a plurality of word lines formed by a second wiring layer extending in a second direction substantially orthogonal to that of said pair of bit lines;

a control line formed by a third wiring layer extending in the first direction;

a decoding signal transferring line formed by a fourth wiring layer extending in the second direction;

a memory cell array comprising a plurality of memory cells, each of said memory cells being connected to said pair of bit lines and a word line at intersections of said pair of bit lines and said word line, each memory cell having a transistor; and a gate electrode line extending in said second direction parallel to and spaced from said word lines, said gate electrode line being connected to a gate electrode of the transistor of said memory cell, wherein said gate electrode line is connected to said word lines at a region other than a region wherein a memory cell is formed by a fifth wiring layer extending in a third direction substantially orthogonal to said first and second directions.

13. A semiconductor memory according to claim 12, wherein said second, third and fourth wiring layers are made of a metal.

* * * * *